United States Patent
Lee et al.

(10) Patent No.: US 9,040,655 B2
(45) Date of Patent: May 26, 2015

(54) DIRECT CH ARYLATION METHOD USING PALLADIUM-BASED CATALYST

(71) Applicant: GWANGJU INSTITUTE OF SCIENCE AND TECHNOLOGY, Gwangju (KR)

(72) Inventors: Jae-Suk Lee, Gwangju (KR); Ashraf A El-Shehawy, Gwangju (KR); Joon-Keun Min, Gwangju (KR); Abdo Nabiha Ibrahim Mahmoud Mahamed, Gwangju (KR)

(73) Assignee: GWANGJU INSTITUTE OF SCIENCE AND TECHNOLOGY, GWANGJU (KR)

( * ) Notice: Subject to any disclaimer, the term of this patent is extended or adjusted under 35 U.S.C. 154(b) by 0 days.

(21) Appl. No.: 14/129,828

(22) PCT Filed: Nov. 20, 2012

(86) PCT No.: PCT/KR2012/009838
§ 371 (c)(1),
(2) Date: Dec. 27, 2013

(87) PCT Pub. No.: WO2013/077615
PCT Pub. Date: May 30, 2013

(65) Prior Publication Data
US 2014/0142263 A1   May 22, 2014

(30) Foreign Application Priority Data
Nov. 21, 2011   (KR) .......................... 10-2011-0121363

(51) Int. Cl.
| | |
|---|---|
| C08G 75/00 | (2006.01) |
| C08F 234/04 | (2006.01) |
| C08G 61/12 | (2006.01) |
| H01L 51/00 | (2006.01) |
| H01L 51/05 | (2006.01) |
| H01L 51/42 | (2006.01) |

(52) U.S. Cl.
CPC .............. *C08F 234/04* (2013.01); *Y02E 10/542* (2013.01); *C08G 61/122* (2013.01); *C08G 61/126* (2013.01); *C08G 2261/124* (2013.01); *C08G 2261/1412* (2013.01); *C08G 2261/3223* (2013.01); *C08G 2261/3241* (2013.01); *C08G 2261/3243* (2013.01); *C08G 2261/364* (2013.01); *C08G 2261/413* (2013.01); *C08G 2261/414* (2013.01); *C08G 2261/92* (2013.01); *H01L 51/0036* (2013.01); *H01L 51/0043* (2013.01); *H01L 51/0545* (2013.01); *H01L 51/4226* (2013.01); *Y02E 10/549* (2013.01)

(58) Field of Classification Search
USPC ........................... 528/377, 380; 526/171, 256
See application file for complete search history.

(56) References Cited

U.S. PATENT DOCUMENTS

| | | | | |
|---|---|---|---|---|
| 2008/0262183 | A1* | 10/2008 | Lehmann .......................... | 528/7 |
| 2009/0066233 | A1* | 3/2009 | Laird et al. .................... | 313/504 |
| 2009/0227763 | A1 | 9/2009 | Sensfuss et al. | |

OTHER PUBLICATIONS

Kumar et al. (Polym. Chem., 2010, 1, 286-288).*
Borghese Tetrahedron Letters 47 (2006) 9249-9252.*
Abdo et al. (Eur. J. Org. Chem. 2012, 5540-5551).*
Derek J. Schipper et al., Direct Arylation as a Synthetic Tool for the Synthesis of Thiophene-Based Organic Electronic Materials, Article, 2011, p. 1594-1600, vol. 23, ACS Publication, American Chemical Society.
Ming Li et al., Gold(I)-Catalyzed Direct C-H Arylation of Pyrazine and Pyridine With Aryl Bromides, Article, 2009, p. 1478-1481, Elsevier.
Jia Jia Dong et al., Palladium-Catalysed Direct 3- or 4-Arylation of Thiophene Derivatives Using Aryl Bromides, Article, 2009, p. 2778-2781, Elsevier.
International Search Report for PCT/KR2012/009838 mailed on Mar. 28, 2013.

* cited by examiner

*Primary Examiner* — Shane Fang
(74) *Attorney, Agent, or Firm* — Lowe Hauptman & Ham LLP

(57) ABSTRACT

A method for producing a copolymer includes reacting a first monomer with a second monomer using a Pd-based catalyst, wherein the first monomer is a first hetero cyclic compound which includes a first hetero atom selected from S, N, and O, the first hetero cyclic compound in which a carbon atom adjacent to the first hetero atom is coupled with at least one hydrogen atom, and the second monomer is a second hetero cyclic compound which includes a second hetero atom selected from S, N, and O, the second hetero cyclic compound in which the second hetero atom is coupled with a carbon atom in which a halogen group selected from Br, Cl, and I is substituted.

4 Claims, 4 Drawing Sheets

DIRECT CH ARYLATION METHOD USING PALLADIUM-BASED CATALYST

CROSS REFERENCE TO RELATED APPLICATION

This application claims the priority of Korean Patent Application No. 10-2011-0121363 filed on Nov. 21, 2011 in the KIPO (Korean Intellectual Property Office). Further, this application is the National Phase application of International Application No. PCT/KR2012/009838 filed on Nov. 20, 2012, which designates the United States and was published in Korean.

TECHNICAL FIELD

The present invention relates to a direct CH arylation method using a palladium-based catalyst.

BACKGROUND ART

Recently, π-conjugated oligo- and polyalkylthiophen have received great attention due to excellent optical and electronic properties. The optical and electronic physical properties may be found in various organic materials such as materials of an organic thin film transistor, a liquid crystal compound, a conductive material, and materials of a dye sensitized solar cell. A development of a method of easily synthesizing and deforming an organic material is an attractive problem in organic synthesis. Cross-coupling using a transition-metal-catalyst was a powerful method for introducing a substituent into a proper position of a hetero aromatic structure by reacting an organic halogen compound with an organic metal reagent to form carbon-carbon coupling. Coupling reactions having various names like a grinard reagent (Kumada-Tamao), boron (Suzuki-Miyaura), zinc (Negishi), and tin (Migita-Kosugi-Stille) were used as a transition-metal-catalyst reaction coupling partner for forming the carbon-carbon coupling. However, most of synthesis methodologies were performed in two steps of organic metal intermediates and chemical compatibility thereof was often restricted.

On the other hand, if hetero aryl derivative coupling such as thiophen is performed in CH coupling, the method may be efficient in an economic standpoint. In particular, since C—H arylation minimizes costs relating to stoichiometric metal wastes and costs relating to preparation of a starting material, the C—H arylation has been an attractive alternative to the existing C—C cross coupling reaction. It was reported that the direct, position specific arylation of a thiophen influence electron donator group reacts at position No. 2 and/or position No. 5. Further, a thiophen influence electron acceptor group may be directly coupled with aryl halide/hetero aryl halide at position 2- and/or position 5-under a so-called Heck-type experiment condition (Jeffrey condition).

Thieno pyrazine based oligomer and/or polymer may be produced using the above-mentioned development methodologies to avoid the general cross method. It was shown that thieno[3,4-b]pyrazine becomes an excellent precursor to produce low-band-gap conjugated polymer. However, to completely use these compounds in a photo electromagnetic effect, there is a need to develop a general synthesis path which may be applied to the majority of other functions.

DISCLOSURE

Technical Problem

The present invention has been made in an effort to provide a method for performing one step reaction of direct CH-acylation of thieno pyrazine derivative by using a Pd(OAc)$_2$ catalyst and a copolymer produced by the method.

Technical Solution

According to an exemplary embodiment of the present invention, there is provided a method for producing a copolymer including reacting a first monomer with a second monomer using a Pd-based catalyst, wherein the first monomer is a first hetero cyclic compound which includes a first hetero atom selected from S, N, and O, the first hetero cyclic compound in which a carbon atom adjacent to the first hetero atom is coupled with at least one hydrogen atom, and the second monomer is a second hetero cyclic compound which includes a second hetero atom selected from S, N, and O, the second hetero cyclic compound in which the second hetero atom is coupled with a carbon atom in which a halogen group selected from Br, Cl, and I is substituted.

According to another exemplary embodiment of the present invention, there is provided a method for producing a copolymer of the following Chemical Formula 10 including reacting a first monomer with a second monomer using a Pd-based catalyst, wherein the first monomer is selected from compounds of the following Chemical Formulas 1 to 4 or a mixture thereof; and the second monomer is selected from compounds of the following Chemical Formulas 5 to 9 or a mixture thereof,

[Chemical Formula 1]

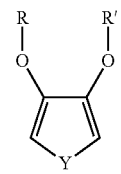

[Chemical Formula 2]

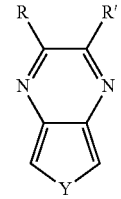

[Chemical Formula 3]

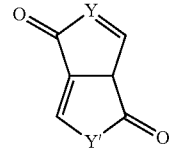

[Chemical Formula 4]

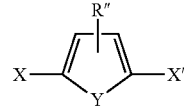

[Chemical Formula 5]

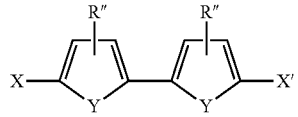

[Chemical Formula 6]

[Chemical Formula 7]

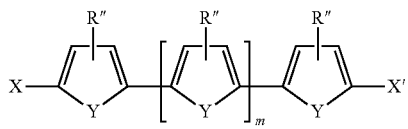

[Chemical Formula 8]

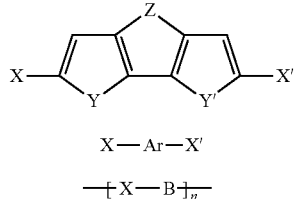

[Chemical Formula 9]

X—Ar—X'

[Chemical Formula 10]

—(X—B)$_n$— in the Chemical Formula 10, the A is selected from the following Chemical Formulas 11 to 14 or a combination thereof; the B is selected from the Chemical Formulas 15 to 19 or a combination thereof; mark * represents a coupled portion; and the n is an integer of 30 to 500,

[Chemical Formula 11]

[Chemical Formula 12]

[Chemical Formula 13]

[Chemical Formula 14]

[Chemical Formula 15]

[Chemical Formula 16]

[Chemical Formula 17]

[Chemical Formula 18]

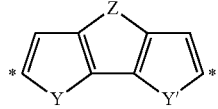

[Chemical Formula 19]

*Ar*, in the Chemical Formulas, Y, Y' are each selected from S, O, and N independently; the R, R' each are an alkyl group of $C_1$ to $C_6$ independently; the R" represents a phenyl group; the X, X' are each selected from Br, Cl, and I independently; the m is an integer of 1 to 4; the Z is selected from Si, C, and N; the Ar represents benzene; and the X and X' coupled with the Ar is coupled at position 1,3- or position 1,4- of the Ar.

The Pd-based catalyst may be $Pd(OAc)_2$. The reaction may be performed with N,N-dimethylformamide including potassium acetate (KOAc) and t-Bu4NBr. As described above, when the reaction of the present invention is performed within the N,N-dimethylformamide including potassium acetate (KOAc) and t-Bu4NBr under the $Pd(OAc)_2$ catalyst, it is possible to show high yield and purity without adding the microwave condition.

According to another exemplary embodiment of the present invention, there is provided a copolymer produced according to several implementation examples of the present invention.

The copolymer may have a band gap ($E_g^{ec}$) of 0.8 to 1.8 eV.

Advantageous Effects

According to the exemplary embodiments of the present invention, a method for performing the one step reaction of the direct CH-acylation of the thieno pyrazine derivative by using the $Pd(OAc)_2$ catalyst may produce various polymers having the lower band gap at low cost and time, compared to the cross-coupling reaction according to the related art.

BEST MODE

Figure 1:
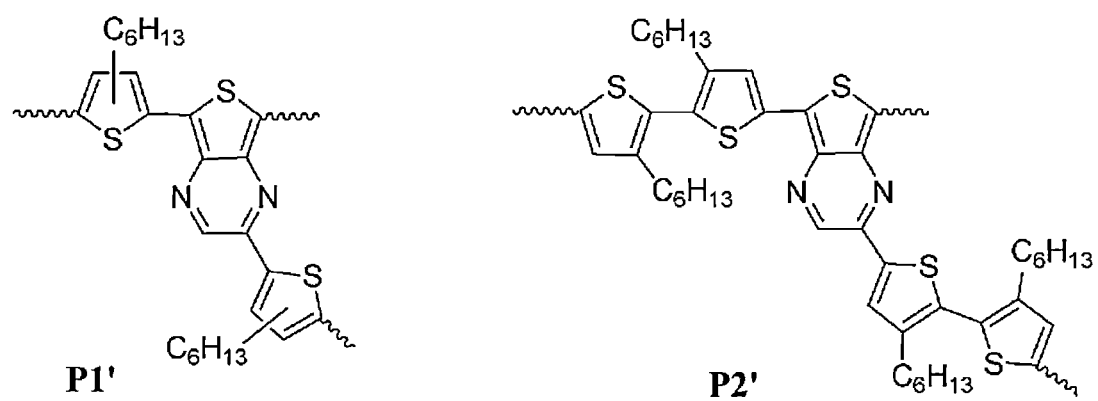
FIG. 1 illustrates a structural formula of P1' and P2'.

Hereinafter, various implementation examples of the present invention will be described in more detail.

Thieno[3,4-b]pyrazines 4a, b and 5,7-dibromo derivatives 5a, b were each selected for research and synthesized at high yield by modifying a part of an experiment method.

[Reaction Formula 1]

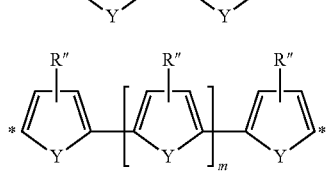 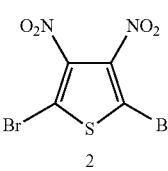 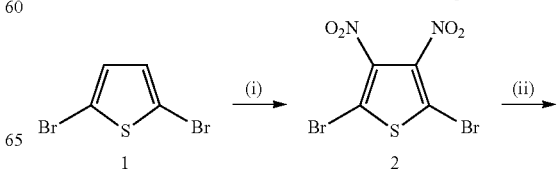

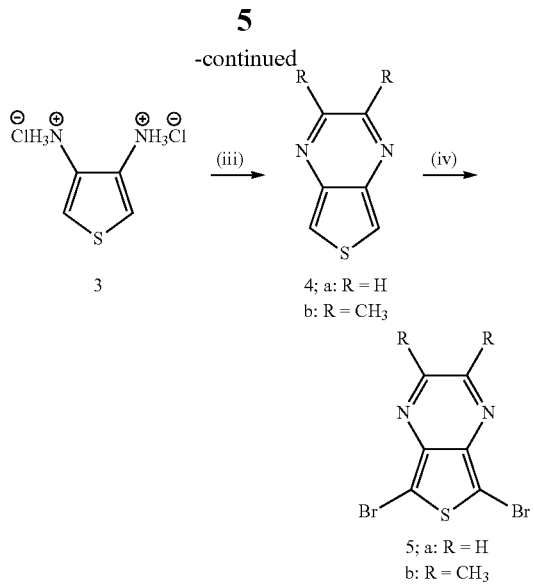

Reagent and condition of synthesis (5a, b) of 5,7-dibromo-thieno[3,4-b]pyrazine derivatives: i) C. H2SO4/F. H2SO4/F. HNO3, ice bath to r. temp., 3 h; (ii) Sn/HCl, overnight 0° C.; (iii) for 4a: glyoxal, aq. K2CO3, r. temp. 3 h; for 4b: dimethylglyoxal, CH2Cl2/EtOH/triethylamine/reflux 50° C.; (iv) for 5a: NBS, AcOH/CHCl3, r. temp., overnight; for 5b: NBS, DMF, 0° C. to r. temp., 7 hrs.

As the result of nitridizing 2,5-dibromothiophen (1) by using a mixture of fuming nitric acid and concentrated sulfuric acid, 2,5-dibromo-3,4-dinitrothiophen (2) was synthesized at 61% yield. As tin and hydrochloric acid which are injected along with 2 are reduced, the thieno[3,4-b]pyrazine derivatives each corresponding to 4a and 4b is generated as the result of dihydrochloride salt of 3,4-diaminothiophen (3) including glyoxal or dimethyl glyoxal. 5,7-dibromo-thieno[3,4-b]pyrazine derivatives corresponding to 5a and 5b were each generated at an excellent yield by a bromization reaction of 4a and/or 4b and N-bromosuccinimide (NBS). All the compounds are purified by flash silica gel column chromatography and a structure thereof is confirmed by 1H- and 13C-NMR and elementary analysis, respectively.

In the Heck-experiment condition using a catalyst system such as Pd(OAc)$_2$/n-Bu4NBr, the direct CH-arylation of non-substitution-TP 4a and 2-bromo-3-hexylthiophen 6a was first surveyed.

[Reaction Formula 2]
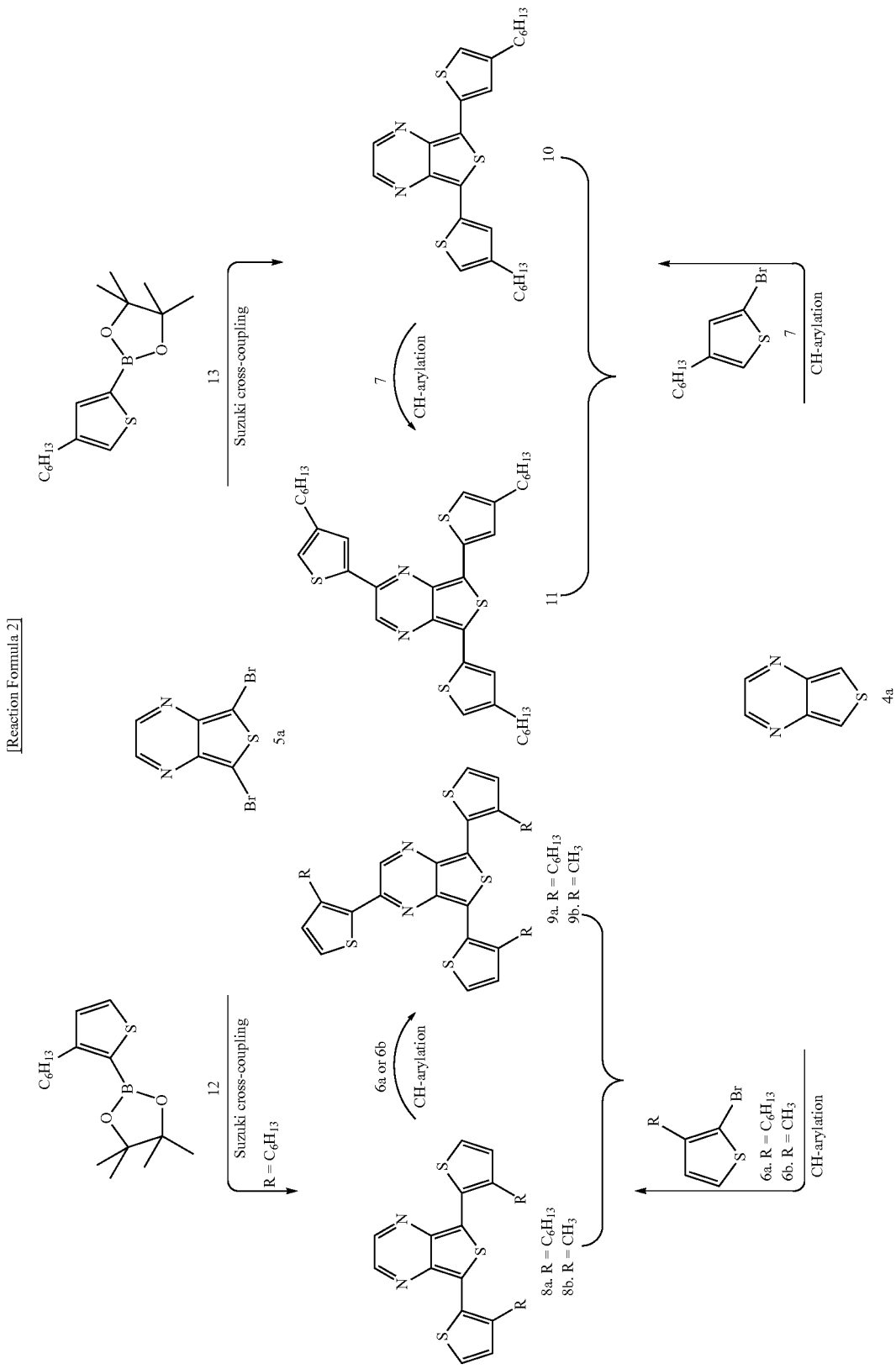

A reagent an a condition of position specific arylation of the thieno[3,2-b]pyrazine derivatives: CH-arylation (DMF, potassium acetate, tert-butylammonium bromide, Pd(OAc)$_2$, 80° C.; Suzuki coupling ((Pd(PPh3)4, toluene, 24 h, 90° C.).

When 6a is injected at 2 molar magnification depending on an amount of a starting material 4a in the temperature reaction condition, the CH-arylation of 4a and 6a generates products 8a and 9a with two and three aryl groups at 50% and 22% yields. When being injected at a ratio of 6a/4a=3/1, the starting material little remains by the same reaction method and products 8a with two aryl groups were generated at 66% yield and products 9a with three aryl groups were generated at 25% yield. The increase in reaction time, temperature, and a ratio of 6a/4a (up to 5/1 molar ratios) did not show a special change in a ratio of the arylated product.

In a microwave condition, the CH-arylation of 4a and 6a (4a/6a=1/3 molar ratios) provides 8a and 9a, which are the same arylated compound, only within 5 minutes. Most of the reaction compounds having the same configuration are present. A long reaction time (at least 30 minutes) due to the microwave does not have an important effect on the reaction process. Interestingly, the CH-arylation of 8a and 6a which are the compounds with two aryl groups provides the compound 9a with three aryl groups corresponding to 35% yield along with the starting material (~54%), which was found by the column chromatography. This was not confirmed even by GC and/or TLC analysis of any important additional aryl coupled compound.

The direct CH-arylation of 2-bromo-3-methylthiophen 6b and 4a is also surveyed. In the microwave reaction condition, the CH-arylation reaction of 4a and 6b (4a/6b=1/5 molar ratios) obtained a mixture of the compounds 8b (77% yield) with two aryl groups and the compounds 9b (18% yield) with three aryl groups. The improvement in the yield of the compound arylated by introducing a methyl group having a hexyl chain into thiophen ring is shown, but the important additional aryl coupling reactant may not be searched. The above-mentioned result shows that position No. 4 of the TP portion has much more reduced arylation reaction than all of other positions, in particular, position No. 3 under the applied reaction condition. This is due to the result of a steric hindrance effect which is generated while the fourth alternative is performed. Further, it is shown that positions 3 and/or 4 of the TP portion have the more reduced reaction to the CH-arylation than positions 5 and 7.

Under the microwave reaction condition, the result similar to the CH-arylation of 4a and 2-bromo-4-hexylthiophen 7 (molar ratio; 4a/7=1/3) was observed and the compounds 10 (60% yield) with two aryl groups and the compounds 11 (33% yield) with three aryl groups were shown (scheme 2). Further, any symptom including the starting material and/or the additional aryl coupled compound is not found by the TLC and/or GC analysis. The direct CH-arylation of 10 showed the compounds 11 (29% yield) with three aryl groups and the starting material (58%) after the chromatography. It is valued that the compounds 8a and 10 with two aryl groups are prepared at a high yield (89 and 85%) by Suzuki cross coupling of 5,7-dibromothieno[3,4-b]pyrazine 5a and boronic esters 12 or 13. It is proved that the spectrum result is the same. Therefore, while a CH proton of imine is activated by covalence of a double coupling with a lone pair in a nitrogen atom, the CH-acylation reaction of the non-substitution TP 4a and 6a or 7 has better position selectivity at the positions Nos. 5 and 7 of the TP unit and is activated by the conjugation of sulfur and imine of TP.

As expectation, 1H-NMR of the two acylated compounds 8a, b and 10 showed a single peak of 8.55, 8.54, and 8.40 ppm which is generated from a α-methine proton adjacent to nitrogen (N=CH—CH=N; integration value, 2) and the single peak (however, the same relative concentration) of the substantially similar chemical shift corresponding to 8.54, 8.44, and 8.50 ppm of the α-methine proton (N=CH—CH=N; integration value, 1) showed the three acylated compounds 9a, b, and 11 which show the CH arylation of a non-substitution pyrazine ring (4 or position No. 4) under the applied reaction condition.

Under the same condition as the Heck experiment by the microwave irradiation, the CH-acylation of 3,4 dimethylthienopyrazines 4b and 6a or 7 (molar ratios of 4b/6a or 7=1/3) smoothly generated 2,7-diarylated TP derivatives 14 and 15, respectively, at an excellent yield (each 93% and 95%, Reaction Formula 3). Other additional side products might not be observed by the TLC and/or GC analysis. However, the reaction of 4b and 7 (1:2 molar ratios) generates mono- and a mixture of two acylated compounds 16 and 15, respectively, at 15% and 57% yields. Therefore, an exceeding of bromide derivatives is basically required for reaction completeness.

Interestingly, the CH-arylation of the compounds 16 and 7 (1:1.5 molar ratio) with one aryl group exclusively generates the compound 15 with two aryl groups at a high yield (93%). It is valued that the compounds 14 and 15 with two aryl groups are prepared at an excellent yield by the Suzuki cross-coupling (each 92% and 88%) of 5b and 12 or 13. It was found that the spectral data are the same and coincide with the proposed structure. The result shows that the success of the CH arylation of the TP derivative permits the polyaryl-TP derivative using the palladium-catalyst acylation subsequent to the Suzuki-cross coupling. A structure of all the synthesis compound is confirmed by 1H and 13C NMR and elementary analysis.

[Reaction Formula 3]

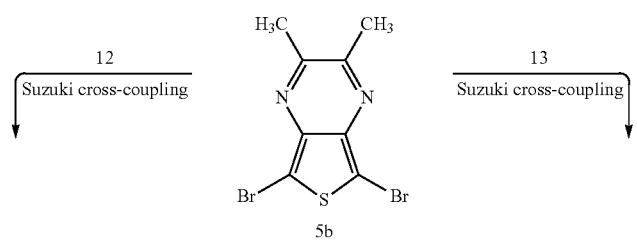

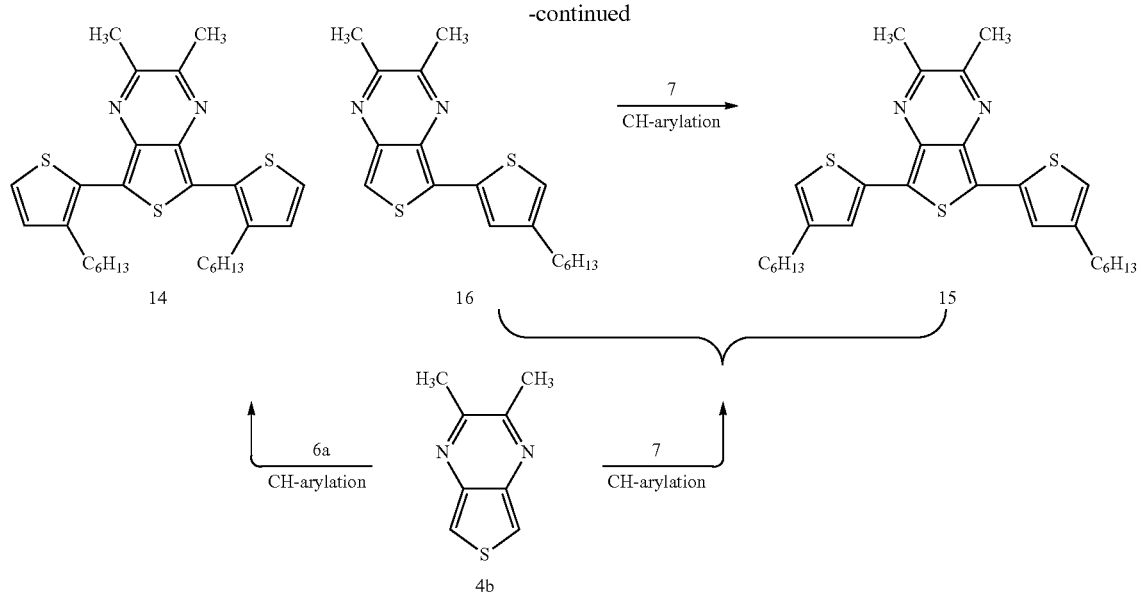

A reagent and a condition of CH arylation of 3,4-dimethylthieno[3,2-b]pyrazine derivatives: CH-acylation (DMF, potassium acetate, tert-butylammonium bromide, Pd(OAc)$_2$, 80° C.) Suzuki coupling ((Pd(PPh3)4, toluene, 24 h, 90° C.).

1H NMR spectrums of the two acylated compounds which are the result of 3,4-dimethyl-TP 14 and 15 and the single acylated compound 16 each show a member of the α-methine proton and the single peak 2.66, 2.57, and 2.54 ppm which are generated from the methine hydrogen (N=CCH3-CCH3=N).

The mechanism of the CH-acylation reaction by the catalytic action of the palladium coupling was represented by Reaction Formula 4. The observed selectivity of positions No. 5 and/or No. 7 of the CH-acylation of TP may be described by the reaction mechanism depending on a similar logic which is previously considered for the acylation of 3-carboalkoxy furan, 3,4-dialkoxythiophen, and EDOT. In the mechanism (path A), a DMF solvent prefers ionization of Ar—Pd—Br in Ar—Pd+Br-species. The electron affinity species Ar—Pd+Br— provides intermediate X1 and reacts at the position 5 of the electron-rich TP. The extraction of proton and the reduction removal of species X1 provide a 5-acylated compound X2 along with Pd0.

On the other hand, it was expected that C—H activation/C—C coupling formation may reach positions 3 and/or 4 of the TP portion by a method similar to the C—O coupling formation. It is considered that the mechanism for CH activation/C—C coupling formation (Reaction Formula 4-path B) is progressed by the control of palladium of the indication group by the C—H activation. Next, the C—C coupling formation reduction removal of X3 provides the desired compound X4. Finally, a ligand exchange of compound for a substrate of PdII by the rapid C—H activation returns the PdII to a resting state of a catalytic period. As shown in the previous result and Reaction Formula 4, two mechanisms may be operated independently.

[Reaction Formula 4]

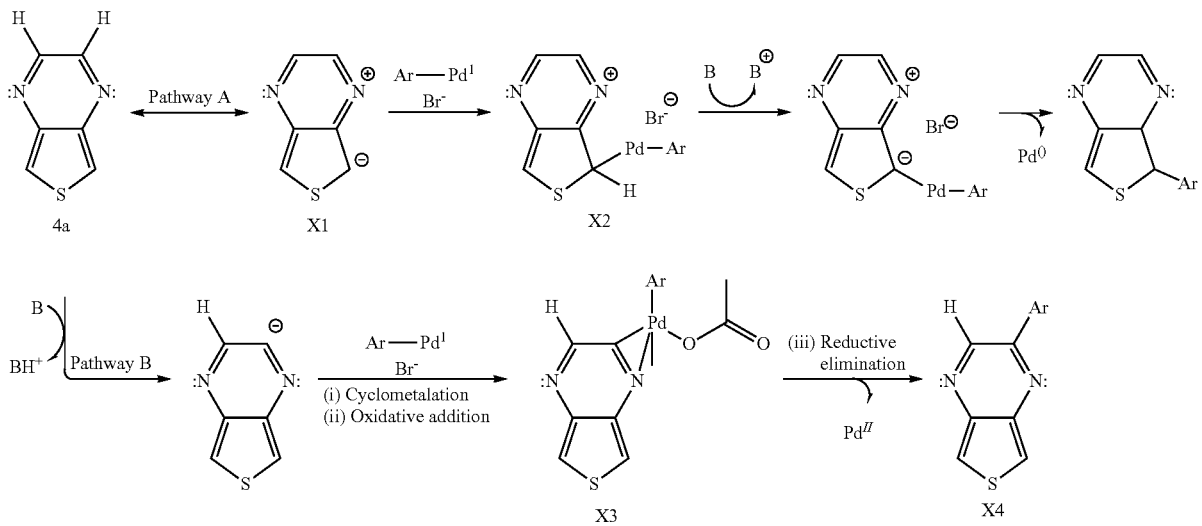

2,7-diarylated thienopyrazine may be obtained under the weak CH-acylation reaction condition and an interest was changed to application of a methodology of a synthesis method of partial π-conjugated copolymers based on thienopyrazine and hexylthiophen residue. The partial TP-based copolymer was first surveyed by using a stile cross coupling method using a model experiment palladium catalyst (Reaction Formula 5). It was proved from the previous experiment that the experiment using the microwave is more effective and the copolymerization reaction was performed by irradiating the microwave under a N,N-dimethylformamide (DMF) solvent under the presence of the amount of Pd(PPh3)4 catalyst. The stile cross coupling of 5a and 3-hexylthiophen-2,5-diyl-bis(tributylstannane) 17 or 3,3'-dihexyl-5,5'-bis(tributylstannyl)-2,2'-bithiophen 19 which have the same mole generates the copolymers P1 and P2 each having 93% and 95% yields. In the same reaction condition, the copolymerization of 5b and 17 or 19 generated the copolymers P3 and P4 having the high yield (92% and 91%, respectively). As the result, the copolymer obtained a proper average molecular weight (Mn) and a polydispersity index (PDI) value (see Table 1).

TABLE 1

Table 1. Polymerization results and thermal properties of copolymers PBTHT and P1-P6[a]

| Polymer | $M_n$ (Kg/mol)[b] | PDT $(M_w/M_n)$[b] | Yield (%)[c] | $T_d$ (° C.)[e,f] | $T_g$ (° C.)[e,g] |
|---|---|---|---|---|---|
| PBTHT | 18.63 | 2.10 | 87 | 365.8 | 72.4 |
| P-1 | 27.91 (22.20)[d] | 1.50 (1.6)[d] | 97 (95)[d] | 383.16 | 109.45 |
| P-2 | 25.69 (16.39)[d] | 1.55 (1.55)[d] | 93 (82)[d] | 380.07 | 141.81 |
| P-3 | 28.72 | 1.62 | 92 | 351.44 | 151.77 |
| P4 | 25.74 (18.37)[d] | 1.40 (2.15)[d] | 88 (91)[d] | 390.53 | 118.82 |
| P-5 | 19.69 (15.79)[d] | 1.49 (2.77)[d] | 89 (90)[d] | 369.84 | 185.72 |
| P6 | 24.08 | 1.40 | 91 | 354.59 | 194.56 |

[a]All polymerizations were carried out using Stille cross coupling method in DMF in presence of Pd(PPh3)4 under microwave conditions expect only for otherwise stated note.
[b]Calculated from GPC (Elueut CHCl3, polystyrene standards; see Supporting Information for their SEC curves).
[c]Based on the weight of polymer obtained after Soxhlet extraction and drying under vacuum.
[d]Values in parentheses are for copolymers obtained from polymerization under direct CH-arylation method
[e]Measured on the polymer samples obtained by microwave polymerization.
[f]Onset decomposition temperature (5% weight loss) measured by TGA under nitrogen atmosphere at a heating rate of 10° C./min.
[g]Determined by DSC under nitrogen atmosphere at a heating rate of 10° C./min.

The final structure of copolymer was confirmed by the elementary analysis and the 1H NMR analysis. The 1H NMR of P1 and P2 (repeated unit) each showed a wide single peak of Ca. 8.53 and Ca. 8.50 ppm which are generated from the α-methine proton adjacent to (N=CH—CH=N; integration value, 2) and showed a linear form of the P1 and P2 (repeated unit). It was shown that the 1H NMR of P3 and P4 each are a wide peak inserted between the α-methylene protons of the hexyl chain and a disappearance of the α-methine proton and an appearance of methyl proton at Ca. 2.66 and Ca. 2.65 ppm. An aliphatic proton showed a wide resonance peak which reaches a region from 0.85 to 2.66 ppm due to a polymer characteristic.

Next, in order to introduce the simple synthesis method for constructing the TP-based π-conjugated copolymer, the advantages of simple-acylation of the TP residue was introduced (Reaction Formula 5 and Table 1).

[Reaction Formula 5]

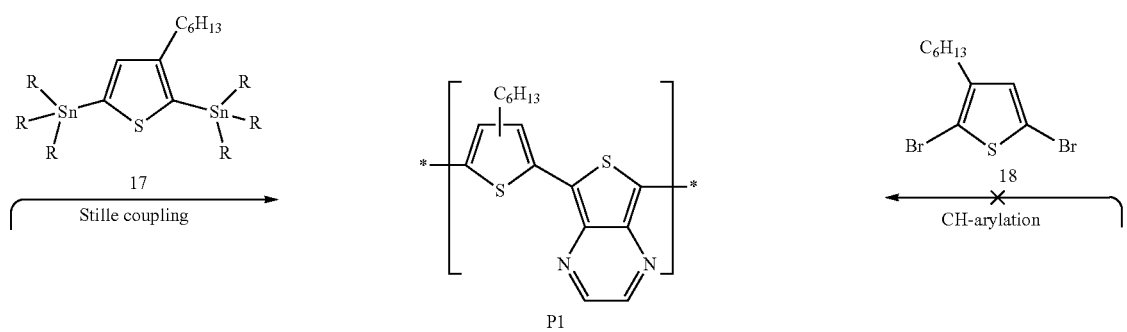

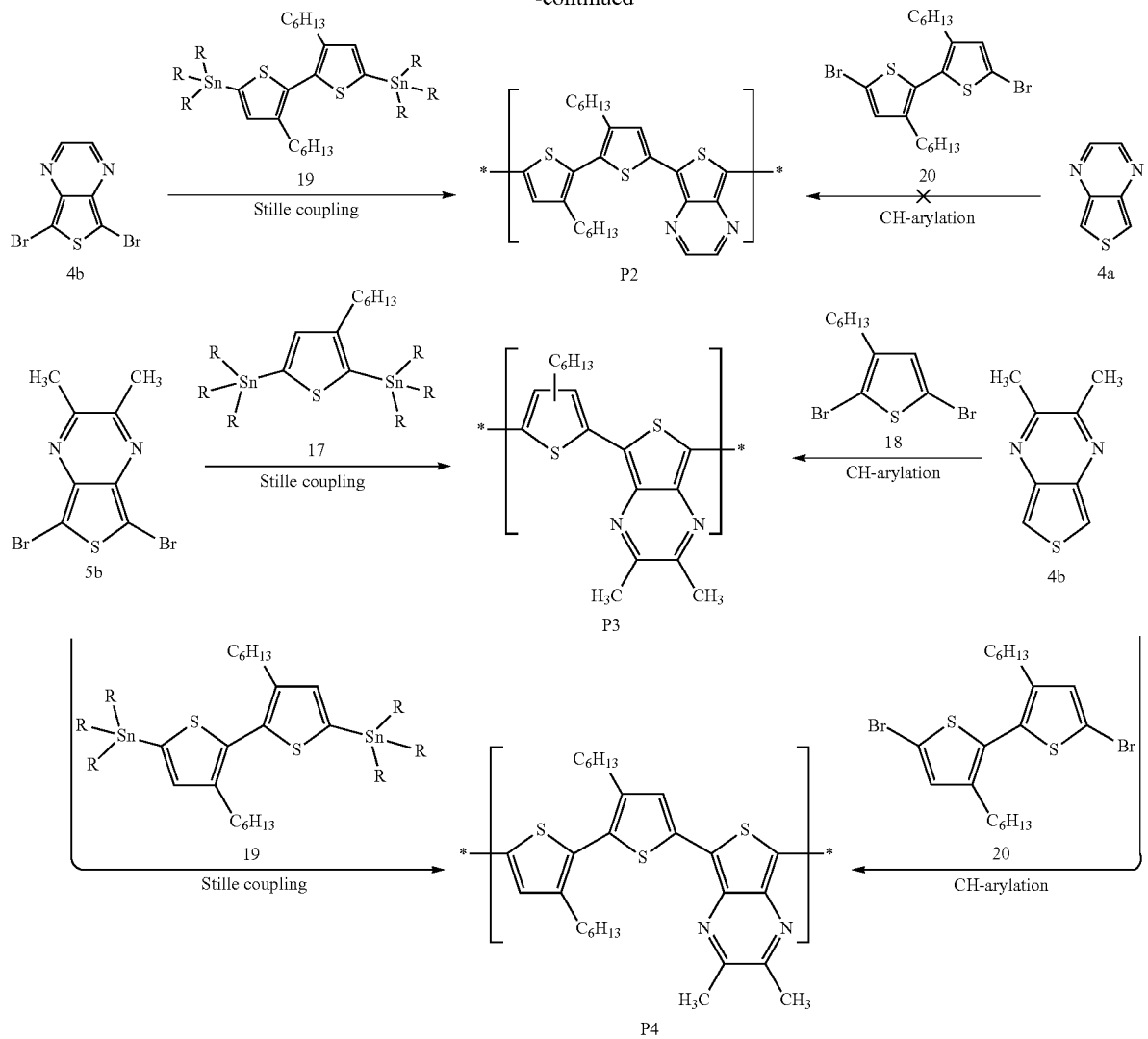

A polymerization condition of a general synthesis path for the synthesis of the π-conjugated copolymer based on thienopyrazine and hexylthiophen moieties: stile-cross coupling: Pd(PPh3)4, DMF, microwave irradiation; CH-arylation: DMF, potassium acetate, tetrabutylammonium bromide (TBAB), Pd(OAc)$_2$.

The polymerization reaction was performed under the presence of the dried DMF and KOAc, n-Bu4NBr(TBAB), and catalytic amounts of Pd(OAc)$_2$. The polymerization of 2,5-dibromo-3-hexylthiophen 18 and/or 5,5'-dibromo-3,3'-dihexyl-2,2'-bithiophen 20 and the non-substitution TP by the palladium catalyst CH-acylation was first survey under the microwave reaction condition. Comparing with the copolymer models P1 and P2 which are obtained by the stile-cross coupling method, it was found that the characteristic of the synthesized copolymer are different from each other.

The partially dissolved copolymer was performed by attempting several reaction conditions and then performing the CH-acylation of 4a and 18 or 20 in the DMF at 130° C. for 15 minutes under the presence of Pd(PPh3)4 (P1' and P2', respectively). However, the polymerization reaction for the polymer which is melted in a long reaction time and/or a high temperature and a minimum amount of general organic solvent was performed.

It was found that comparing with the P1 and P2 obtained by the stile-cross coupling method, the 1H-NMR spectrums of the solubility portion of copolymers P1' and P2' are different from each other. The 1H NMR for P1' and P2' each showed the wide single peak Ca. 8.56 and Ca. 8.50 ppm (N=CH—C=N; integral value, 1) generated from the α-methine proton adjacent to N atoms, radiation of the integral value of the peak, and the coincidence of the P1' and P2' structure illustrated in FIG. 1, respectively.

Therefore, a portion of the crossing is generated based on 3,4 position substitution of the TP residue based on the previous mechanism of the CH-acylation of TP (refer to Reaction Formula 4). The GPC analysis for P1' and P2' solubility portions showed a polydispersity index (PDI) value of 3.91 and 4.26 and a maximum mean molecular weight (Mn) of 5855 and 5470.

Interestingly, in the Heck reaction condition, the palladium catalyst CH acylation reaction using the 3,4-dimethyl-TP 5a and 18 or 20 provided the copolymer of high yield (92% and 94%; Table 1) and comparing with the copolymers P3 and P4 prepared by the stile cross coupling method, it was found that 1H-NMR and UV-vis spectrum data thereof are the same.

It is described that the copolymer educed by methanol and then purified is repeatedly washed with the methanol and filtered and then is repeatedly Soxhlet extracted with methanol and acetone to remove products and oligomer. It was showed that the palladium catalyst is clearly removed by the analysis of the purified copolymer. All the synthesized copolymers (except P1' and P2') have (>10 mg mL-1) the excellent solubility in a room-temperature organic solvent, for example, in the general organic solvent such as chloroform, xylene, and chlorobenzene. Similarly, the copolymers P3 and P4 shown in Table 1 each have the high Mn values corresponding to the copolymers P1 and P2. This is generated due to the increase in the number of hexylthiophen in the repeated unit of P3 and P4.

Figure 2A:
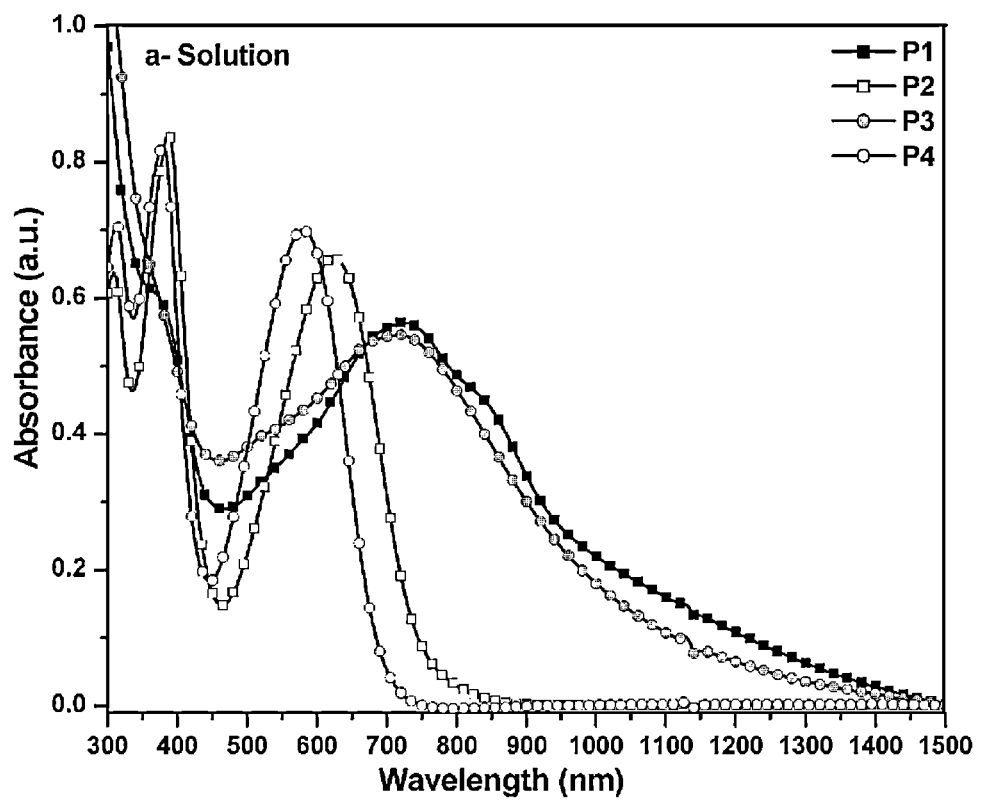
FIGS. 2A and 2B illustrate UV-Vis absorbance spectrum of copolymer P1-P4.
Figure 2B:
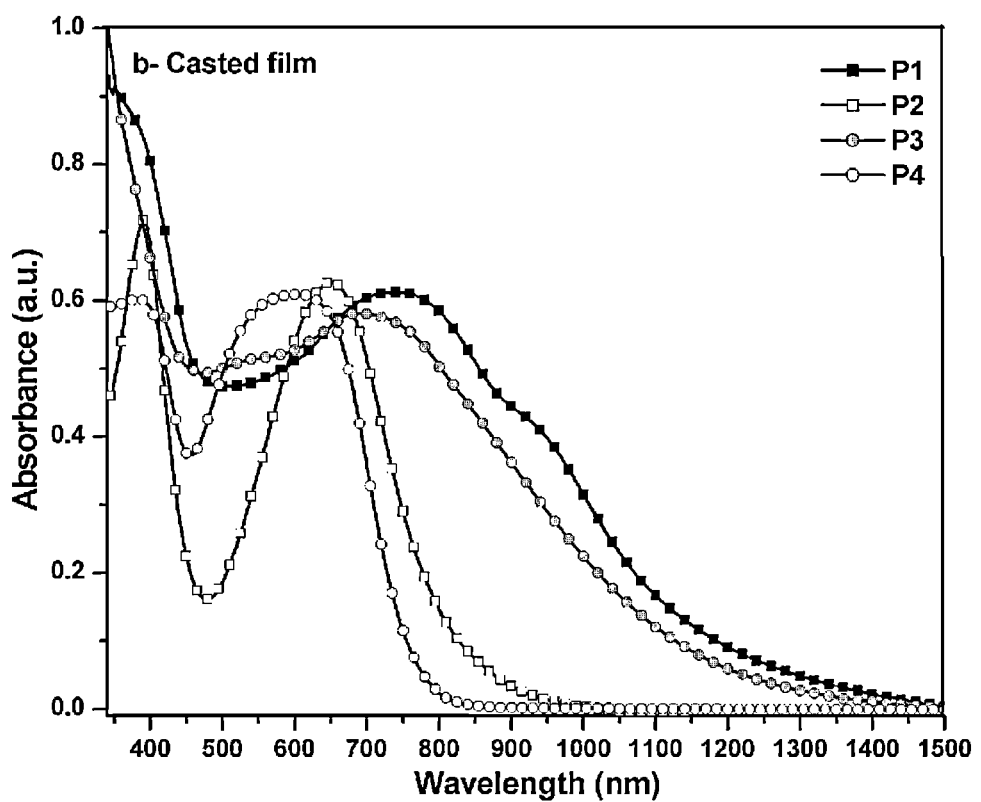

The synthesized copolymers P1-P4 are spin-coated on a glass slide in a chlorobenzene solution to form a thin film and FIGS. 2A and 2B each illustrates the general UV-vis absorbance spectrum obtained in the chlorobenzene solution and the solid state film. The expectation of absorption maximum λ max, generation wavelength λ onset, and optical band gap Egop from the λ onset was arranged in Table 1. The film showed a red shift and the wide absorption which are highlighted in the UV-Vis absorbance spectrum as compared with one corresponding to the absorption in the solution and reflects the increase in interstrand interaction in the solid state and the elongated π-conjugation. Therefore, the optical band gap of all the polymer which are found in λ onset [Egop(eV)= 1240/λ onset(nm)] is lower in the thin film than in the solution. The copolymers P1-P4 have two absorption peaks within the range of 300 to 1500 nm as characteristics, in connection with functions observed for the replacement of donator-acceptor copolymer. As observed in the optical measurement, the expected Egop value (1.06-1.63 eV) of the copolymers P1-P4 is lower than P3HT (ca. 1.9 eV) and it was confirmed that it is important to include the appropriate additional acceptor apparatus in the P3HT so as to achieve a narrow band gap.

Figure 3:
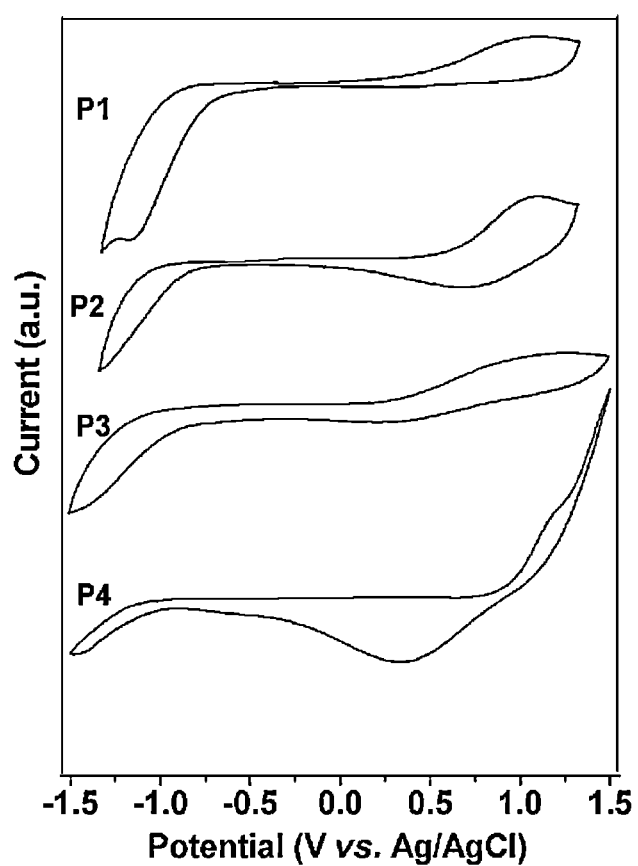
FIG. 3 illustrates a repeated cyclic voltammograms experiment result of P1-P4.

The electrical characteristic of the copolymers P1-P4 was surveyed by a cyclic voltammetry (CV) and was illustrated in FIG. 3. HOMO and LUMO energy levels EHOMO and ELUMO of the copolymer are determined by the following relationship Formula; EHOMO=−Eox−4.4 and ELUMO=−Ered−4.4 (in eV) and Eox and Ered of polymer to Ag/AgCl reference electrode are the oxidation and reduction generation possibility. The derived EHOMO and ELUMO and the electrochemical band gap (Egec=ELUMO−EHOMO) was arranged in Table 1. The expected Egec value may be higher than the expected optical band gap Egop in the thin film due to an interface barrier between the polymer film and the electrode surface. The case in which the substituent is introduced into the positions 3 and 4 of the TP pyrazine residue affects the electrochemical behavior was written (FIGS. 2A and 2B).

The effect represented by the HOMO and LUMO energy levels is considerably derived by the increase in the number of HT pieces in the repeated unit. Generally, since the HOMO level is higher in the hexylthiophen unit [P1(−4.85), and P3(−4.70); in eV] including a plane polymer than in the more twisted polymer including the two HT residues [P2 (−5.11) and P4 (−5.32); in eV], the previous class of polymer having the elongated π-conjugation shows a lower value (1.29 and 1.19 eV, respectively) than the latter (1.69-1.96 eV). Most of the expected HOMO level of the copolymers P1-P3 (−4.85, −5.11, and 4.70 eV) is higher than an air oxidation threshold value (Ca. −5.27 eV) which represents the excellent stability of the polymers toward air and oxygen, which is an essential condition for apparatus application programs. Meanwhile, an open circuit voltage Voc of an organic solar cell has a direction connection with a difference between the HOMO level of the electron donator (polymer) and the LUMO level of the electron acceptor (PCBM). The low HOMO level for the donator polymer is concluded in the high Voc of the generated polymer solar cell. The estimated LUMO level of the P1-P4 (−3.36 to −3.56 eV) is higher than the PCBM (−4.3 eV) and permits photo-induction electron transmission which is advantageous in the PCBM. Therefore, in particular, the copolymers such as P1 and P3 will be a promising candidate for the donator polymer which is used in an active layer of the PCBM-based BHJ organic photoelectric apparatus. The analysis of a deeper structure of the polymer thin film is out a range of a study which is currently published and will be reported to other places.

In summary, a facial method accompanying the direct CH-acylated step reaction of the thienopyrazine derivative using the Pd(OAc)$_2$ catalyst under the generally used Heck-type experiment condition has been developed. Comparing to the cross-coupling reaction, macro chemical compatibility of the recent method permitted the synthesis of various aryl groups which is affected by the TP oligomer. The simplicity and usefulness of the methodology for synthesizing some of the TP based copolymers were proved. Integrating the TP portion into the P3HT chain has a great affect on the photophysical and electrochemical characteristics of the copolymer. From the viewpoint of the optical and electrochemical characteristics, the synthesis of the copolymers, in particular, P1 and P3 are attractive candidates as activated materials in the organic solar and optoelectronic apparatus.

That is, the production method according to the exemplary embodiment of the present invention may be potentially used in an advanced organic material, and the like, and the reaction is a powerful tool of several π-conjugated oligo- and/or hetero polymer aromatic systems and is potentially effective to construct the thienopyrazine library and may be used in various combination syntheses of the substitution thienopyrazine.

The following examples are proposed to help understand some implementation examples of the present invention and therefore may not be construed as being limiting the scope or contents of the present invention.

EXAMPLES

Experiment Preparation Portion (1) Material: Unless separately described, the reaction including a reagent sensitive to all the operations and air was performed under a drying nitrogen atmosphere without oxygen. All the reagents and solvents were purchased through a general supplier and was dried depending a standard procedure prior to being used. All the reactions were completed after being confirmed with TLC. 3,3'-Dihexyl-5,5'-bis(tributylstannyl)-2,2'-bithiophen 19 and 2,5-dibromo-3-hexylthiophen 18 were prepared.

(2) Machine use and method: The 1H and 13C NMR spectrums were measured at 25° C. by a Varian spectrometer (400 MHz for 1H and 100 MHz for 13C) using CDC13 containing a TMS standard material and the chemical shift was written in ppm unit. A coupling constant J was given by Hz. The flash column chromatography used a merck silica gel 60 (particle size of 230 to 400, mesh ASTM). A neutral silica gel was prepared by adding triethylamine to the silica gel by using the same solvent used in the column chromatography. The thin film chromatography (TLC) analysis used a product in which an aluminum plate is coated with a merck 0.25 mm 60F silica gel and was performed in UV-254 fluorescence. The UV-vis adsorption spectrum was obtained by measuring a pure polymer sample using a Varian Cary UV-Vis-NIR-5000 spectrophotometer. The cyclic voltammetry (CV) measurement was performed by a B-class solar simulator.

Potentiostate/Galvanostate (SP-150 OMA company); an electrolyte was measured at a concentration of tetrabutylaluminum hexafluorophosphate (TBAPF6) 0.1 M under an acetonitrile solvent at a scan speed of 50 mVs-1. A 3-electrode cell was used; a platinum wire and silver/silver chloride [Ag in 0.1 M KCl] were each used as a counter and a reference electrode. The polymer film for the measurement was formed by spin-coating the ITO glass slide with a polymer-chlorobenzene solvent (Ca. 10 mg/mL) gel permeation chromatography analysis was performed using a Shimadzu (LC-20A Prominence Series) machine; chloroform was used as a transport solvent (flow rate: 1 mL/min, at 30° C.) and a correction curve was quenched with a polystyrene standard sample. The microwave adjuvant polymerization reaction was performed by a microwave synthesis system CEM (discover S-class system). The low temperature reaction was essentially performed by a cryostat (PSL1810-SHANGHA EYELA). A KD scientific syringe pump (KDS-100) was used to provide an accurate amount of reagent during a process of precisely distributing a reagent and adding a reagent by one drop.

2,5-dibromo-3,4-dinitrothiophen 2. A flask having three branches dried in high vacuum is added with a mixture of concentrated sulfuric acid (12.4 mL), fuming sulfuric acid (19.1 mL), and fuming nitric acid (10.5 mL) and is cooled in an ice tank and is slowly added 2,5-dibromothiophen (1, 3.35 mL, 7.2 g, 29.7 mmol) by one drop to keep a temperature inside the flask at 15° C. After the addition is completed, the reaction mixture additionally reacts at 25-30° C. for three hours and then is poured with at least 100 g of ice. Ice was melted and a yellow solid residue was collected by vacuum filtering and the recrystallization was performed in methanol (5.0 g, 51%). 13C NMR (DMSO, 100 MHz, δ/ppm): 139.62, 116.66. C4Br2N2O4S (331.93): calcd. C, 14.47; Br, 48.15; N, 8.44; S, 9.66. found C, 14.43; Br, 48.31; N, 8.37; S, 9.72.

3,4-diaminothiophen dihydrochloride 3. The concentrated hydrochloric acid (230 mL) and the 2,5-dibromo-3,4-dinitrothiophen (2, 12.8 g, 38.0 mmol) were mixed in the flask and cooled in the ice tank. Metal tin (31.9 g, 269 mmol) was slowly added over 1 hour while being kept at 25-30° C. After the addition is completed, the reaction was agitated until all the tin is consumed and the flask was then stored in a refrigerator overnight. The solid precipitate was withdrawn by the vacuum filtering and is washed with diethylether and acetonitrile. Product 2H+ salt 3 is very stable, whereas a free amine compound is very sensitive to oxidation. For this reason, a precursor is stored in a product 2H+ salt state. In the case of pre diaminothiophen conversion; product 2H+ salt was melt in water of 600 mL and cooled in the ice tank. The solution was made in a 4N Na2CO3 basic state and then extracted with diethylether, was dried with anhydrous sodium sulfate, and concentrated by a rotating evaporation apparatus without being heated to obtain white 3,4-diaminothiophen crystal (2.6 g, 61%). 1H NMR (CDCl3, 400 MHz, δ/ppm): 6.16 (s, 2H, 2×CHS), δ 3.36 (s, br, 4H, 2×NH2). 13C NMR (CDCl3, 100 MHz, δ/ppm): 137.2, 101.7. C4H6N2S (114.17): calcd. C, 42.08; H, 5.30, N, 24.54; S, 28.09. found C, 42.18; H, 5.50, N, 24.66; S, 27.92.

Thieno[3,4-b]pyrazine (4a). The 3,4-dimaniothiophen dihydrochloride (3, 1.03 g, 5.52 mmol) was put in 5% aq. Na2CO3 (60 mL). Glyoxal (0.36 g, 6.1 mmol) obtained by diluting 40% of glyoxal solution of 0.885 g with water of 15 ml was slowly added by one drop for five minutes. The reaction mixture was agitated at room temperature for three hours and was extracted several times by ether and/or ethyl acetate. The mixed organic layer was washed with water, was dried with anhydrous sodium sulfate, and concentrated with a rotating decompression apparatus without being heated to obtain bright brown oil. An analysis sample was prepared by melting oil in a minimum amount of dichloromethane and was purified by the column chromatography using hexane to obtain a bright light brown solid 4a (0.57 g, 76%). 1H NMR (CDCl3, 400 MHz, δ/ppm): 8.51 (s, 2H, N═CHCH═N), 8.03 (s, 2H, 2×CH—S). 13C NMR (CDCl3, 100 MHz, δ/ppm): 144.41, 142.80, 118.00. C6H4N2S (136.17): calcd. C, 52.92; H, 2.96; N, 20.57; S, 23.55. found C, 53.07; H, 3.11; N, 20.50; S, 23.63.

2,3-dimethylthieno[3,4-b]pyrazine 4b; 2,3-butanedione (1.63 g, 19 mmol), 3,4-diaminothiophendihydrochloride (3; 3.5 g, 18.70 mmol), and triethylamine (95 mL) were mixed in a mixed solution of dichloromethane (170 mL) and ethanol (170 mL), which was then agitated at 50° C. for 8 h. The reaction mixture was cooled and then extracted with the mixed solution of dichloromethane/water. The organic layer was collected and dried with sodium sulfate. The purification was performed by the silica gel flash column chromatography (chloroform/ethyl acetate 4:1) to obtain the bright light brown solid (2.45 g, 80% yield). 1H NMR (CDCl3, 400 MHz, δ/ppm): 2.55 (s, 6H), 7.71 (s, 2H). 13C NMR (CDCl3, 100 MHz, δ/ppm): 153.14, 141.69, 115.92, 23.62. C8H8N2S (164.23): calcd. C, 58.51; H, 4.91; N, 17.06; S, 19.52. found C, 58.59; H, 5.06; N, 17.01; S, 19.60.

5,7-dibromothieno[3,4-b]pyrazine 5a. Chloroform/acetic acid (1:1; 60 mL) was added with the thieno[3,4-b]pyrazine (4a, 2.0 g, 14.7 mmol) solution, cooled at 0° C., and then added with NBS (5.75 gm, 32.3 mmol) three times. The reaction mixture was agitated at room temperature overnight and was then added with the same amount of water. The chloroform layer was separated, washed with water, and dried with anhydrous sodium sulfate. The organic layer was evaporated under the decompression without being heated to obtain a yellow solid which emits green light. The obtained solid before being purified was washed with ether several times (until a color of ether appears as colorless by using a Decandation method) Next, the solid was purified with the silica gel flash column chromatography (hexane/CH2Cl2; 1:1) to a pure yellow solid compound 5a (1.62 g, 75%). 1H NMR (CDCl3, 400 MHz, δ/ppm): 8.53 (s, 2H, N═CHCH═N). 13C NMR (CDCl3, 100 MHz, δ/ppm): 145.61, 140.60, 105.78. C6H2Br2N2S (293.97): calcd. C, 24.51; H, 0.69; Br, 54.36; N, 9.53; S, 10.91. found C, 24.44; H, 0.67; Br, 54.49; N, 9.56; S, 11.05.

5,7-dibromo-2,3-dimethylthieno[3,4-b]pyrazine 5b; The solution in which 4b (0.48 g, 2.92 mmol) is put in the DMF (100 mL) was slowly added with the solution in which NBS (1.14 g, 6.42 mmol) is melted in the DMF (300 mL) by one drop and was cooled in the ice tank. Next, the temperature of the reaction mixture was increased to room temperature and agitated for 6 hours. The reaction mixture was poured into water and extracted with chloroform. The organic layer was collected and washed with a sodium chloride solution and dried with sodium sulfate. Next, the reaction mixture was purified with chloroform and flash silica gel chromatography to obtain a yellowish brown solid (0.79 g, 85% yield). 1H NMR (CDCl3, 400 MHz, δ/ppm): 2.68 (s, 2H). 13C NMR (CDCl3, 100 MHz, δ/ppm): 155.18, 139.27, 103.20, 23.42. C8H6Br2N2S (322.02): calcd. C, 29.84; H, 1.88; Br, 49.63; N, 8.70, S, 9.96. found C, 30.05; H, 1.92; Br, 49.42; N, 8.77; S, 9.88.

5,7-Bis(3-hexylthiophen-2-yl) thieno[3,4-b]pyrazine 8a

Experiment Method A: Suzuki-Cross-Coupling:
A mixture of 5,7-dibromothieno[3,4-b]pyrazine (5a, 0.5 g, 1.70 mmol), 2-(3-hexylthiophen-2-yl)-4,4,5,5-tetramethyl-1, 3,2-dioxaborolane (12, 1.25 g, 4.25 mmol), and Pd(PPh3)4 (0.5 g, 43.5 mol %) is melted in toluene (35 mL) and is added with a K2CO3 (2 M, 30 mL) aqueous solution after gas is removed with nitrogen for 20 minutes. The reaction mixture is violently agitated and is fed-back at 100° C. for 12 hours. The reaction mixture is cooled and extracted with CH2C12, and the organic layer is collected and washed with water and is dried with anhydrous sodium sulfate. The solvent is distilled under the decompression and the compound before being purified was purified by the flash silica gel column chromatography (n-hexane/EtOAc=10:2) to obtain purple 8a (0.70 g, 89% yield).

Experiment Method B: CH-Arylation

The solution in which 4a (1 equiv) is put in the DMF (50 mL) is added with Potassium acetate (6 equiv), tert-butylammonium bromide (2 equiv), 2-bromo-3-hexylthiophen (6a, equiv), and finally, palladium acetate (0.2 equiv) and agitated. The generated suspension was agitated at 80° C. overnight. After the reaction ends, the mixture was cooled at room temperature and is added with CH2C12 and water. The organic layer was separated and concentrated. The dark oil resultant was purified by the flash silica gel chromatography under the n-hexane/EtOAc (2%) condition to obtain the purple solid compound 8a (50% yield) and the sticky purple oil 9a (22% yield).

Compound 8a: 1H NMR (CDC13, 400 MHz, δ/ppm): 8.55 (s, 2H, N=CH—CH=N), 7.43-7.41 (d, J=8 Hz, 2H, CH—S), 7.06-7.04 (d, J=Hz, 2H, CH—C-hexyl), 2.87-2.83 (t, J=16 Hz, 4H, 2×ArCH2CH2-), 1.70-1.67 (m, 4H, 2×ArCH2CH2-), 1.28-1.25 (m, 12H, 2×CH3 (CH2)3), 0.86-0.83 (t, J=12 Hz, 6H, 2×CH3). 13C NMR (CDC13, 100 MHz, δ/ppm): 144.03, 141.94, 139.68, 129.52, 127.01, 126.71, 126.08, 31.64, 30.47, 29.88, 29.27, 22.58, 14.05. C26H32N2S3 (468.74): calcd. C, 66.62; H, 6.88; N, 5.98, S, 20.52. found C, 66.71; H, 6.81; N, 5.67; S, 20.44.

2,5,7-Tris(3-hexylthiophen-2-yl) thieno[3,4-b]pyrazine 9a

1H NMR (CDC13, 400 MHz, δ/ppm): 8.54 (s, 1H, N=CH—C=N), 7.17-7.16 (d, J=4 Hz, 3H, CH—S), 7.05-7.04 (d, J=4 Hz, 3H, CH—C-hexyl), 2.86-2.84 (m, 6H, 3×ArCH2CH2-), 1.71-1.67 (m, 6H, 3×ArCH2CH2-), 1.30-1.27 (m, 18H, 3×CH3 (CH2)3), 0.89-0.86 (t, J=12 Hz, 9H, 3×CH3). 13C NMR (CDC13, 100 MHz, δ/ppm): 151.46, 144.06, 141.96, 139.63, 137.68, 125.99, 125.48, 123.81, 31.65, 30.26, 29.67, 29.28, 22.59, 14.05. C36H46N2S4 (635.02): calcd. C, 68.09; H, 7.30; N, 4.41, S, 20.20. found C, 68.15; H, 7.44; N, 4.36; S, 20.11.

5,7-Bis(3-methylthiophen-2-yl) thieno[3,4-b]pyrazine 8b

Experiment Method B: CH-Arylation

The solution in which 4a (1 equiv) is in put in the DMF (50 mL) is added with Potassium acetate (6 equiv), tert-butylammonium bromide (2 equiv), 2-bromo-3-methylthiophen (6b, equiv), and finally, palladium acetate (0.2 equiv) and agitated. The generated suspension was agitated at 80° C. overnight. After the reaction ends, the mixture was cooled at room temperature and is added with CH2C12 and water. The organic layer was separated and concentrated. The dark oil resultant was purified by the flash silica gel chromatography under the n-hexane/EtOAc (2%) condition to obtain the dark purple solid compound 8b (77% yield) and the purple solid 9b (18% yield).

Compound 8b: 1H NMR (CDC13, 400 MHz, δ/ppm): 8.54 (s, 2H, N=CH—CH=N), 7.38-7.37 (d, J=4 Hz, 2H, CH—S), 6.98-6.97 (d, J=4 Hz, 2H, CH—C-hexyl), 2.50 (s, 6H, 2×CH3). 13C NMR (CDC13, 100 MHz, δ/ppm): 143.82, 139.30, 136.18, 130.87, 126.67, 125.47, 123.81, 16.29. C16H12N2S3 (328.47): calcd. C, 58.50; H, 3.68; N, 8.53, S, 29.29. found C, 58.66; H, 3.60; N, 8.42; S, 29.30.

2,5,7-Tris(3-methylthiophen-2-yl) thieno[3,4-b]pyrazine 9b

1H NMR (CDC13, 400 MHz, δ/ppm): 8.44 (s, 1H, N=CH—C=N), 7.17-7.16 (d, J=4 Hz, 3H, CH—S), 6.90-6.89 (d, J=4 Hz, 3H, CH—C-hexyl), 2.47 (s, 9H, 3×CH3). 13C NMR (CDC13, 100 MHz, δ/ppm): 151.47, 143.99, 141.96, 138.99, 133.51, 126.31, 125.47, 123.73, 15.65. C21H16N2S4 (424.63): calcd. C, 59.40; H, 3.80; N, 6.60, S, 30.21. found C, 59.30; H, 3.91; N, 6.53; S, 30.16.

5,7-Bis(4-hexylthiophen-2-yl) thieno[3,4-b]pyrazine 10

Experiment Method A: Suzuki-Cross-Coupling:

A mixture of 5a (0.5 g, 1.70 mmol), 2-(4-hexylthiophen-2-yl)-4,4,5,5-tetramethyl-1,3,2-dioxaborolane (13, 1.25 g, 4.25 mmol), and Pd(PPh3)4 (0.5 g, 43.5 mol %) is melted in toluene (35 mL) and is added with the K2CO3 (2 M, 30 mL) aqueous solution after gas is removed with nitrogen for 20 minutes. The reaction mixture is violently agitated and is fed-back at 100° C. for 12 hours. The reaction mixture is cooled and then extracted with CH2C12, and the organic layer is collected and washed with water and is dried with anhydrous sodium sulfate. The solvent is distilled under the decompression and the compound before being purified was purified by the flash silica gel column chromatography (n-hexane/EtOAc=10:2) to obtain the dark purple solid compound 10 (0.67 g, 85% yield).

Experiment Method B: CH-Arylation

The solution in which 4a (1 equiv) is put in the DMF (50 mL) is added with Potassium acetate (6 equiv), tert-butylammonium bromide (2 equiv), 2-bromo-4-hexylthiophen (7, 3 equiv), and finally, palladium acetate (0.2 equiv) and agitated. The generated suspension was agitated at 80° C. overnight. After the reaction ends, the mixture was cooled at room temperature and is added with CH2C12 and water. The organic layer was separated and concentrated. The dark oil resultant was purified by the flash silica gel chromatography under the n-hexane/EtOAc (2%) condition to obtain the purple solid compound 10 (60% yield) and the sticky purple oil 11 (33% yield).

Compound 10: 1H NMR (CDC13, 400 MHz, δ/ppm): 8.40 (s, 2H, N=CH—CH=N, 7.39 (s, 2H, CH—S), 6.90 (s, 2H, CH—C-hexyl), 2.57-2.54 (t, J=12 Hz, 4H, 2×ArCH2CH2-), 1.63-1.56 (m, 4H, 2×ArCH2CH2-), 1.22-1.19 (m, 12H, 2×CH3 (CH2)3), 0.80-0.78 (t, J=8 Hz, 6H, 2×CH3). 13C NMR (CDC13, 100 MHz, δ/ppm): 144.14, 143.76, 138.99, 133.71, 126.40, 121.61, 31.68, 31.58, 30.40, 29.01, 22.64, 14.10. C26H32N2S3 (468.74): calcd. C, 66.62; H, 6.88; N, 5.98, S, 20.52. found C, 66.44; H, 6.75; N, 6.09; S, 20.43.

2,5,7-Tris(4-hexylthiophen-2-yl) thieno[3,4-b]pyrazine 11

1H NMR (CDC13, 400 MHz, δ/ppm): 8.50 (s, 1H, N=CH—C=N, 7.36 (s, 3H, CH—S), 7.26 (s, 2H, CH—C-hexyl), 2.64-2.59 (m, 6H, 3×ArCH2CH2-), 1.70-1.63 (m, 6H, 3×ArCH2CH2-), 1.33-1.25 (m, 18H, 3×CH3 (CH2)3), 0.91-

0.88 (t, J=12 Hz, 9H, 3×CH3). 13C NMR (CDCl3, 100 MHz, δ/ppm): 151.46, 144.06, 143.74, 139.84, 139.56, 137.67, 125.48, 123.81, 31.65, 31.55, 30.66, 29.84, 22.59, 14.05. C36H46N2S4 (635.02): calcd. C, 68.09; H, 7.30; N, 4.41, S, 20.20. found C, 68.00; H, 7.42; N, 4.35; S, 20.24.

5,7-Bis(3-hexylthiophen-2-yl)-2,3-dimethylthieno[3,4-b]pyrazine 14

Method A: Suzuki-Cross Coupling:

A mixture of 5,7-dibromo-2,3-dimethylthieno[3,4-b]pyrazine (5b, 0.5 g, 1.55 mmol), 2-(3-hexylthiophen-2-yl)-4,4,5,5-tetramethyl-1,3,2-dioxaborolane (12, 1.14 g, 3.88 mmol), and Pd(PPh3)4 (0.5 g, 43.5 mol %) is melted in toluene (35 mL) and is added with the K2CO3 (2 M, 30 mL) aqueous solution after gas is removed with nitrogen for 20 minutes. The reaction mixture is violently agitated and is fed-back at 100° C. for 12 hours. The reaction mixture is cooled and then extracted with CH2Cl2, and the organic layer is collected and washed with water and is dried with anhydrous sodium sulfate. The solvent is distilled under the decompression and the compound before being purified is purified by the flash silica gel column chromatography (n-hexane/EtOAc=10:2) to obtain the dark red solid compound 14 (0.71 g, 92% yield).

Method B: CH-Arylation:

The solution in which 4b (1 equiv) is put in the DMF (50 mL) is added with potassium acetate (6 equiv), tert-butylammonium bromide (2 equiv), 2-bromo-3-hexylthiophen (6a, equiv), and finally, palladium acetate (0.2 equiv) and agitated. The generated suspension was agitated at 80° C. overnight. After the reaction ends, the mixture was cooled at room temperature and is added with CH2Cl2 and water. The organic layer was separated and concentrated. The dark oil resultant was purified by the flash silica gel chromatography under the n-hexane/EtOAc (2%) condition to obtain the dark red solid compound 14 (95% yield). 1H NMR (CDCl3, 400 MHz, δ/ppm): 7.39-7.38 (d, J=4 Hz, 2H, CH—S), 7.05-7.04 (d, J=4 Hz, 2H, CH—C-hexyl), 2.91-2.88 (t, J=12 Hz, 4H, 2×ArCH2CH2-), 2.66 (s, 6H, 2×N═C—CH3), 1.76-1.73 (m, 4H, 2×ArCH2CH2-), 1.47-1.31 (m, 12H, 2×CH3 (CH2)3), 0.91-89 (t, J=8 Hz, 6H, 2×CH3). 13C NMR (CDCl3, 100 MHz, δ/ppm): 152.82, 141.13, 138.37, 135.67, 126.34, 125.46, 124.17, 31.68, 30.45, 29.99, 29.36, 23.53, 22.59, 14.05. C28H36N2S3 (496.79): calcd. C, 67.69; H, 7.30; N, 5.64, S, 19.36. found C, 67.77; H, 7.39; N, 5.55; S, 19.30.

5,7-Bis(4-hexylthiophen-2-yl)-2,3-dimethylthieno[3,4-b]pyrazine 15

Method A: Suzuki-Cross Coupling:

A mixture of 5b (0.5 g, 1.55 mmol), 2-(4-hexylthiophen-2-yl)-4,4,5,5-tetramethyl-1,3,2-dioxaborolane (13, 1.14 g, 3.88 mmol), and Pd(PPh3)4 (0.5 g, 43.5 mol %) is melted in toluene (35 mL) and is added with the K2CO3 (2 M, 30 mL) aqueous solution after gas is removed with nitrogen for 20 minutes. The reaction mixture is violently agitated and is fed-back at 100° C. for 12 hours. The reaction mixture is cooled and then extracted with CH2Cl2, and the organic layer is collected and washed with water and is dried with anhydrous sodium sulfate. The solvent is distilled under the decompression and the compound before being purified is purified by the flash silica gel column chromatography (n-hexane/EtOAc=10:2) to obtain the dark purple solid compound 15 (0.68 g, 88% yield).

Method B: CH-Arylation:

The solution in which 4b (1 equiv) is put in the DMF (50 mL) is added with potassium acetate (6 equiv), tert-butylammonium bromide (2 equiv), 2-bromo-4-hexylthiophen (7, 2 equiv), and finally, palladium acetate (0.2 equiv) and agitated. The generated suspension was agitated at 80° C. overnight. After the reaction ends, the mixture was cooled at room temperature and is added with CH2Cl2 and water. The organic layer was separated and concentrated. The dark oil resultant was purified by the flash silica gel chromatography under the n-hexane/EtOAc (2%) condition to obtain the dark purple solid compound 15 (57% yield) and the sticky purple oil 16 (30% yield).

Compound 15: 1H NMR (CDCl3, 400 MHz, δ/ppm): 7.37 (s, 2H, 2×CH—S), 6.86 (s, 2H, 2×CH—C-hexyl), 2.71-2.68 (t, J=12 Hz, 4H, 2×ArCH2CH2-), 2.57 (s, 6H, 2×N═C—CH3), 1.67-1.58 (m, 4H, 2×ArCH2CH2-), 1.30-1.19 (m, 12H, 2×CH3 (CH2)3), 0.88-0.80 (t, J=8 Hz, 6H, 2×CH3). 13C NMR (CDCl3, 100 MHz, δ/ppm): 153.24, 143.52, 137.86, 134.33, 125.77, 123.82, 120.94, 31.69, 31.57, 30.40, 29.00, 23.72, 22.62, 14.10. C28H36N2S3 (496.79): calcd. C, 67.69; H, 7.30; N, 5.64, S, 19.36. found C, 67.55; H, 7.19; N, 5.60; S, 19.44.

5-(4-hexylthiophen-2-yl)-2,3-dimethylthieno[3,4-b]pyrazine 16

1H NMR (CDCl3, 400 MHz, δ/ppm): 7.35 (s, 1H, CH—S), 6.95 (s, 1H, CH—C-hexyl), 6.84 (s, 1H, hexyl-C—CH—S), 2.71-2.68 (t, J=12 Hz, 2H, ArCH2CH2-), 2.54 (s, 6H, 2×N═C—CH3), 1.67-1.57 (m, 2H, ArCH2CH2-), 1.33-1.18 (m, 6H, CH3 (CH2)3), 0.82-0.79 (t, J=12 Hz, 3H, CH3). 13C NMR (CDCl3, 100 MHz, δ/ppm): 153.20, 143.49, 137.88, 134.35, 127.07, 125.73, 123.73, 120.90, 115.05, 31.70, 31.58, 30.40, 29.02, 23.69, 22.64, 14.10. C18H22N2S2 (330.51): calcd. C, 65.41; H, 6.71; N, 8.48, S, 19.40. found C, 65.33; H, 6.79; N, 8.53; S, 19.44.

3-hexylthiophen-2,5-diyl-bis(tributylstannane) 17

The dried THF (100 mL) is added with the 3-hexylthiophen (1 g, 5.94 mmol), cooled at −80° C., and slowly added with n-BuLi (5.94 mL, 14.85 mmol, 2.5 M in hexane) by one drop for 60 minutes. The reaction mixture is agitated at −80° C. for 3 hours. The reaction mixture is slowly added with tributyltin chloride (4.56 mL, 14.85 mmol) by one drop for 30 minutes. After the reaction mixture is agitated at −80° C. for 30 minutes, the reaction mixture rises to room temperature and is additionally agitated for 2 hours and is quenched with the NH4Cl aqueous solution. The reaction mixture is extracted with ethylacetate and then the organic layer is washed with water and dried with anhydrous sodium sulfate. The solvent was evaporated and the mixture before being purified was purified by the flash column chromatography using the silica gel quenched with triethylamine to obtain the desired compound 17 (4.21 g, 95% yield). 1H NMR (400 MHz, CDCl3): δ=7.06 (s, 1H, CH—C-hexyl), 2.76-2.73 (t, J=12 Hz, 2H, ArCH2-, hexyl), 1.62 (m, 14H, ArCH2CH2-, hexyl+6×—(CH2)2-CH2-, butyl), 1.44-1.40 (m, 24H, 6×—(CH2)2-CH2-, butyl), 1.25-1.15 (m, 6H, CH3 (CH2)3-, hexyl), and 0.99-0.91 (m, 21H, CH3, hexyl+6×CH3, butyl) ppm. 13C NMR (100 MHz, CDCl3): δ=144.30, 136.80, 136.05, 125.58, 31.64, 30.91, 29.25 29.09, 27.54, 27.37, 22.77, 14.12, 13.74, 10.78 ppm. C34H68SSn2 (746.39): calcd. C, 54.71; H, 9.18; S, 4.30; Sn, 31.81. found C, 54.59; H, 9.23; S, 4.40.

5,5'-dibromo-3,3'-dihexyl-2,2'-bithiophen 20

The dried THF (65 mL) is added with 3,3'-dihexyl-2,2'-bithiophen (1.7 g, 5.08 mmol) and cooled with ice and added with NBS (2.26 g, 12.70 mmol). The reaction mixture is agitated at 0° C. for 30 minutes and additionally agitated at room temperature overnight and quenched with a NH4Cl saturation aqueous solution. The reaction mixture is extracted with ethylacetate and then the organic layer is washed with water. The organic layer is collected and is removed with anhydrous sodium sulfate and the residual organic solvent is removed under the vacuum. The mixture before being purified was purified by the flash silica gel column chromatography (n-hexane/EtOAc=10:2) to obtain the yellow oil compound 20 (2.35 g, 94% yield). 1H NMR (400 MHz, CDCl3): δ=6.90 (s, 2H, 2×CH—Br), 2.44-2.40 (t, J=16 Hz, 4H, 2×ArCH2), 1.66 (m, 4H, 2×ArCH2CH2), 1.25-1.22 (m, 12H, 2×CH3 (CH2)3, and 0.87-0.84 (t, J=12 Hz, 6H, 2×CH3) ppm. 13C NMR (100 MHz, CDCl3): δ=143.81, 131.37, 128.83, 112.35, 31.56, 30.49, 28.96, 28.71, 22.53, 14.05 ppm. C20H28Br2S2 (492.37): calcd. C, 48.79; H, 5.73; Br, 32.46; S, 13.02. found C, 48.67; H, 5.81; Br, 32.29; S, 13.15.

A general method for stile cross coupling polymerization using a microwave:

A screw lid type glass tube which is dried well is added with the desired dibromo and di-tributylstannyl derivative (0.5 mmol) which have the same molar ratio and are melted in the dried DMF and is added with Pd(PPh)4 (5 mol % relative to Br) after gas included in the mixture is removed using nitrogen for 30 minutes. The glass tube with a lid is put in a microwave reactor and surveyed under the following condition. 5 minutes at 100° C., 5 minutes at 120° C., and 30 minutes at 150° C. A distal end stopper operation is performed in two steps. First, phenylboronic acid pinacol ester was used and then bromobenzene was used. Distal end stopper condition: 2 minutes at 100° C., 2 minutes at 120° C., and 5 minutes at 150° C. Next, as the final distal end stopper method, the screw lid glass tube rises to room temperature and then methanol is poured into the reaction mixture. The polymer before being purified was filtered and collected and then was washed with methanol. The residual solid was loaded into an extraction thimble and washed in methanol for 24 hours and in acetone for 24 hours and was dried in vacuum and then analyzed by a GPC and 1H NMR analyzer.

A general method for CH-arylation polymerization using a microwave:

The screw lid type glass tube which is dried well is added with the desired dibromo- and unsaturated EDOT derivative (0.5 mmol) which are melted in the dried DMF (20 mL) and is added with potassium acetate (6.0 equiv), tetrabutylammonium bromide (TBAB; 2.0 equiv), and Pd(OAc)$_2$ (0.2 equiv) under an nitrogen state after gas included in the mixture is removed using nitrogen for 20 minutes. A tube with a lid is put in the micro reactor and surveyed under the following condition. 5 minutes at 5 min 100° C., 5 minutes at 120° C., and 30 minutes at 150° C. The distal end stopper was performed in one step using phenylboronic acid pinacol ester. The distal end stopper condition is as follows: 2 minutes at 100° C., 2 minutes at 120° C., and finally 5 minutes at 150° C. After the microwave screw lid glass tube rises to room temperature, methanol is poured into the reaction mixture. The polymer before being purified was filtered and collected and then was washed with methanol. The residual solid was loaded into an extraction thimble and washed in methanol for 48 hours and in acetone for 48 hours and was dried in vacuum and then analyzed by a GPC and 1H NMR analyzer.

Poly[(thieno[3,4-b]pyrazine-5,7-diyl)-alt-(3-hexylthiophen-2,5-diyl)] (P1)

1H NMR (CDCl3, 400 MHz, δ/ppm): 8.53 (br s, 2H, N═CH—CH═N), 7.00 (s, br, 1H, CHC-hexyl), 2.64 (br s, 2H, Ar—CH2CH2-), 1.86-1.69 (br s, 2H, Ar—CH2CH2-), 1.32-1.25 (m, 6H, CH3 (CH2)3), 0.89 (br s, 3H, CH3). (C16H16N2S2)n(300.44)n: calcd. C, 63.96; H, 5.37; N, 9.32; S, 21.35. found C, 63.87; H, 5.44; N, 9.25; S, 21.20.

Poly[(thieno[3,4-b]pyrazine-2,5,7-triyl)-2,5-bis(3-hexylthiophen-2,5-diyl)] (P1')

1H NMR (CDCl3, 400 MHz, δ/ppm): 8.56 (br s, 1H, N═CH—C═N), 7.00 (s, br, 2H, 2×CHC-hexyl), 2.68 (br s, 4H, 2×Ar—CH2CH2-), 1.86 (br s, 4H, 2×Ar—CH2CH2-), 1.32-1.25 (m, 12H, 2×CH3 (CH2)3), 0.88 (br s, 6H, 2×CH3). (C26H29N2S3)n(465.72)n: calcd. C, 67.05; H, 6.28; N, 6.02; S, 20.66. found C, 67.00; H, 6.21; N, 5.89; S, 20.53.

Poly[(thieno[3,4-b]pyrazine-5,7-diyl)-alt-(3,3'-dihexyl-2,2'-bithiophen-5,5'-diyl)] (P2)

1H NMR (CDCl3, 400 MHz, δ/ppm): 8.50 (br s, 2H, N═CH—CH═N), 7.58 (s, br, 2H, 2×CHC-hexyl), 2.64 (br s, 4H, 2×Ar—CH2CH2), 1.67-1.66 (br s, 4H, 2×Ar—CH2CH2-), 1.29 (br s, 12H, 2×CH3 (CH2)3), 0.88-0.87 (br s, 6H, 2×CH3). (C26H30N2S3)n(466.72)n: calcd. C, 66.91; H, 6.48; N, 6.00; S, 20.61. found C, 66.78; H, 6.54; N, 5.87; S, 20.69.

Poly[(thieno[3,4-b]pyrazine-2,5,7-triyl)-2,5-bis(3,3'-dihexyl-2,2'-bithiophen-5,5'-diyl)] (P2')

1H NMR (CDCl3, 400 MHz, δ/ppm): 8.50 (br s, 1H, N═CH—C═N), 7.58 (s, br, 4H, 4×CHC-hexyl), 2.64-2.58 (br s, 8H, 4×Ar—CH2CH2), 1.65-1.60 (br s, 8H, 4×Ar—CH2CH2-), 1.29-1.26 (br s, 24H, 4×CH3 (CH2)3), 0.87-0.84 (br s, 12H, 4X CH3). (C46H57N2S5)n(798.28)n: calcd. C, 69.21; H, 7.20; N, 3.51; S, 20.08. found C, 69.43; H, 7.38; N, 3.45; S, 19.87.

Poly[2,3-dimethylthieno[3,4-b]pyrazine-5,7-diyl)-alt-(3-hexylthiophen-2,5-diyl)] (P3)

1H NMR (CDCl3, 400 MHz, δ/ppm): 6.98 (s, 1H, CHC-hexyl), 2.66 (br s, 8H, Ar—CH2CH2+2×N═CCH3), 1.73 (br s, 2H, Ar—CH2CH2-), 1.30-1.25 (br s, 6H, CH3 (CH2)3), 0.89-0.88 (br s, 3H, CH3). (C18H22N2S2)n(330.51)n: calcd. C, 65.41; H, 6.71; N, 8.48; S, 19.40. found C, 65.32; H, 6.81; N, 8.59; S, 19.29.

Poly[2,3-dimethylthieno[3,4-b]pyrazine-5,7-diyl)-alt-(3,3'-dihexyl-2,2'-bithiophen-5,5'-diyl)] (P4)

1H NMR (CDCl3, 400 MHz, δ/ppm): 7.52 (br s, 2H, 2×CHC-hexyl), 2.65-2.63 (br s, 10H, 2×Ar—CH2CH2+2×N═CCH3), 1.67-1.59 (br m, 4H, 2×Ar—CH2CH2-), 1.35-1.29 (br m, 12H, 2×CH3 (CH2)3), 0.91-0.85 (br m, 6H, 2×CH3). (C28H34N2S3)n(494.78)n: calcd. C, 67.97; H, 6.93; N, 5.66; S, 19.44. found C, 68.13; H, 6.85; N, 5.77; S, 19.36.

INDUSTRIAL APPLICABILITY

Comparing to the cross-coupling reaction according to the related art, it is possible to produce various polymers having a low band gap with low cost and time.

The invention claimed is:
1. A method for producing a copolymer including reacting a first monomer with a second monomer using a Pd-based catalyst, wherein the first monomer is a first hetero cyclic compound which includes a first hetero atom selected from S, N, and O, the first hetero cyclic compound in which a carbon atom adjacent to the first hetero atom is coupled with at least one hydrogen atom, and the second monomer is a second hetero cyclic compound which includes a Chemical Formula

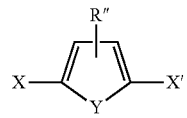

where Y is selected from S, N, and O; X, X' are each independently selected from Br, Cl, and I; and R″ represents a phenyl group.

2. A method for producing a copolymer of the following Chemical Formula 10 including reacting a first monomer with a second monomer using a Pd-based catalyst, wherein the first monomer is a compound of the following Chemical Formula 3; and the second monomer is selected from compounds of the following Chemical Formulas 5 to 9 or a mixture thereof,

[Chemical Formula 3]
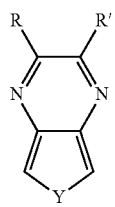

[Chemical Formula 5]
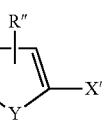

[Chemical Formula 6]
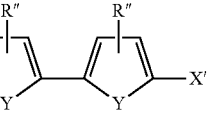

[Chemical Formula 7]
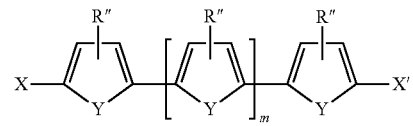

[Chemical Formula 8]
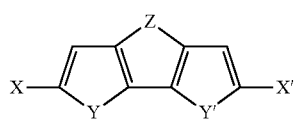

[Chemical Formula 9]
X—Ar—X'

[Chemical Formula 10]
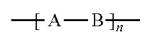

in the Chemical Formula 10, the A has a structure of the following Chemical Formula 13; the B is selected from the following Chemical Formulas 15 to 19 or a combination thereof; mark * represents a coupled portion; and the n is an integer of 30 to 500,

[Chemical Formula 13]
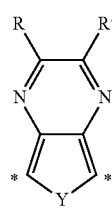

[Chemical Formula 15]
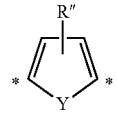

[Chemical Formula 16]
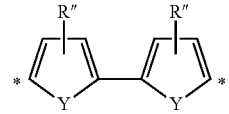

[Chemical Formula 17]
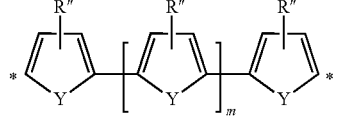

[Chemical Formula 18]
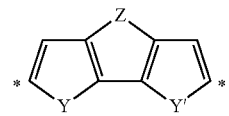

[Chemical Formula 19]
*Ar*, in the Chemical Formulas, Y, Y' are each selected from S, O, and N independently; the R, R' each are an alkyl group of $C_1$ to $C_6$ independently; the R″ represents a phenyl group; the X, X' are each selected from Br, Cl, and I independently; the m is an integer of 1 to 4; the Z is selected from Si, C, and N; the Ar represents benzene; and the X and X' coupled with the Ar is coupled at position 1,3- or position 1,4- of the Ar.

3. The method of claim 1, wherein the Pd-based catalyst is $Pd(OAc)_2$.

4. The method of claim 1, wherein the reaction is performed within N,N-dimethylformamide including potassium acetate (KOAc) and t-Bu4NBr.

* * * * *